United States Patent [19]

Mattelin

[11] Patent Number: 4,943,346

[45] Date of Patent: Jul. 24, 1990

[54] METHOD FOR MANUFACTURING PRINTED CIRCUIT BOARDS

[75] Inventor: Antoon Mattelin, Oostkamp, Belgium

[73] Assignee: Siemens Aktiengesellschaft, Berlin and Munich

[21] Appl. No.: 401,834

[22] Filed: Sep. 1, 1989

[30] Foreign Application Priority Data

Sep. 29, 1988 [DE] Fed. Rep. of Germany ....... 3833094

[51] Int. Cl.$^5$ ............................ B44C 1/22; C23F 1/02; C03C 15/00; C03C 25/06
[52] U.S. Cl. ....................................... 156/651; 29/846; 29/852; 156/656; 156/659.1; 156/661.1; 156/902; 204/129.1; 427/97
[58] Field of Search ............ 156/643, 651, 656, 649.1, 156/661.1, 666, 902; 204/129.1; 427/96, 97; 29/846, 852; 174/68.5

[56] References Cited

U.S. PATENT DOCUMENTS 3,374,129  3/1968  Boucher .......................... 156/901 X
3,764,422 10/1973  Koritke et al. ............... 156/661.1 X
3,850,711 11/1974  Conley ........................ 156/661.1 X

FOREIGN PATENT DOCUMENTS 0062300 10/1982 European Pat. Off. .

Primary Examiner—William A. Powell
Attorney, Agent, or Firm—Hill, Van Santen, Steadman & Simpson

[57] ABSTRACT

A method for manufacturing printed circuit boards has a double etch process to form interconnection wiring. A metal layer is formed on the substrate. An etch resist layer is applied to the metal layer. The layer is selectively removed to allow for selective etching of the metal layer. A second etch resist layer is applied to the metal layer not previously etched. The side walls of the metal layer are also protected by the resist. The second etch resist layer is then selectively removed to allow for a second etching of the metal layer. After the second etching, the interconnection wiring remains in the desired pattern. The second etch resist layer, which may be tin, can be left on the wiring to improve component soldering.

17 Claims, 2 Drawing Sheets

METHOD FOR MANUFACTURING PRINTED CIRCUIT BOARDS

BACKGROUND OF THE INVENTION

1. Field of the Invention

The invention relates to a method for manufacturing printed circuit boards using integrated circuit fabrication technology.

2. Description of the Prior Art

In standard printed circuit board manufacturing, an etch resist layer is applied onto a metal layer. This resist layer is then selectively removed to form a resist pattern so that the metal layer can be selectively etched. The etch resist layer is then completely removed to leave an interconnection pattern. Such a process is disclosed in EP-A-No. 0 062,300. The selective removal of the etch resist layer can be accomplished using a scan method with a laser. However, this conventional method is involved and time-consuming. This is particularly true when the interconnects lie relatively far apart and large surfaces of the etch resist layer must be removed.

SUMMARY OF THE INVENTION

An object of the present invention is to provide an improved method for manufacturing printed circuit boards so that the selective removal of the etch resist layer with electromagnetic radiation can be executed quickly and with little expense.

The above object is achieved in a method executed in accordance with the principles of the present invention. First, a metal layer and a first etch resist layer are successively applied onto an electrically insulating substrate. The first etch resist layer is then selectively removed with electromagnetic radiation in those regions over the areas of the metal layer that will be etched. The areas of the metal layer exposed from selective removal of the etch resist layer are etched away down to the surface of the substrate. The first etch resist layer is then completely removed. A second metallic etch resist layer is applied onto the remaining regions of the metal layer. Some of the remaining regions do not correspond to the interconnect pattern that is desired. These regions are connected to the anode of a voltage source. Next, the etch resist over the anodically contacted regions is electrolytically removed. The regions of the metal layer exposed are etched away down to the surface of the substrate.

Differing from conventional methods, the method of the invention has only the regions of the first etch resist layer that are adjacent and above the regions of the metal layer to be etched are removed with electromagnetic radiation. The formation of the first etch resist pattern, using electromagnetic radiation, can be quickly executed due to the small area of first etch resist layer to be eroded. After the etching then, however, the undesired regions of the metal layer remain between the interconnects. The second etch resist layer is formed on all regions of the metal layer. The undesired regions can be anodically contacted with little effort and expense after the interconnects (desired regions of the metal layer) are encapsulated with a second etch resist layer. The second etch resist layer on the undesired region is removed. The encapsulation of the interconnects with etch resist is preserved, so that only the undesired regions of the metal layer between the interconnects will be etched away.

A major advantage of the method of the present invention is total isolation of the interconnects on the substrate. The interconnects represent islands that are not anodically contacted. Conversely, all undesired metal surfaces must be electrically connected to one another. This connection is easily achieved by a corresponding design of the interconnect patterns, clamps, contact bridges or the like.

In a preferred embodiment of the method of the invention, after the metal layer is etched down to the substrate, the first etch resist layer is completely removed before the application of the second etch resist layer. This allows for the second resist layer to encapsulate the desired regions of the metal layer or interconnects. Such encapsulation guarantees the protection of the interconnects during the etching of the undesired regions of the metal layer.

In another embodiment of the method of the invention, the metal layer is applied onto the substrate by currentless and voltaic deposition of copper. This type of metal layer deposition is particularly advantageous when manufacturing interconnects having through-contacts. Metallization of the corresponding through-contact holes can also be formed by the currentless and voltaic deposition of copper.

It has also proven especially beneficial when tin or a tin-lead alloy is employed for the first and second etch resist layers. These etch resist layers can be structured with a laser so they guarantee reliable protection of the metal interconnection layer lying therebelow during etching.

The first etch resist layer and the second etch resist layer are preferably applied by currentless metal deposition. This can be implemented in an especially economical fashion to provide reliable protection of the metal layer to be used as interconnects.

The electromagnetic radiation is preferably generated by a laser which is well suited for the removal of etch resist layers. The movement of the laser beam relative to the substrate should be freely programmable. The desired design of the interconnect pattern can be quickly implemented while maintaining modification capabilities.

The method of the invention provides similar economic benefits when a three-dimension, injection molded substrate having injected through-contact holes is employed. Such substrates can be fabricated in great numbers at low cost by injection molding. The three-dimensional design of the substrates or printed circuit boards does not present any problem in structure generation with electromagnetic radiation.

DETAILED DESCRIPTION OF THE DRAWINGS

FIGS. 1 through 10 show highly simplified, cross-sectional views of the printed circuit board during the various steps in the manufacturing method according to the principles of the present invention.

DETAILED DESCRIPTION OF THE PREFERRED EMBODIMENTS

Figure 1:
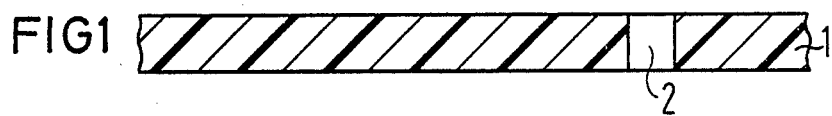

The substrate 1 illustrated in FIG. 1 involves a portion of a base material having injected through-contact holes 2. High-temperature-resistant thermoplastics, such as fiberglass or reinforced polyetherimide, are particularly suitable as materials for the substrate of printed circuit boards manufactured according to the method of the present invention.

The substrate 1 shown in FIG. 1 was cleaned and stained to improve the adhesion of the interconnects and through-contactings thereto. Commercially available baths were employed for both the staining and the cleaning of the substrate 1. The staining bath is specifically adapted to the particular substrate material.

Figure 2:
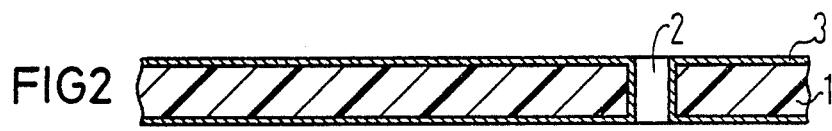
Figure 3:
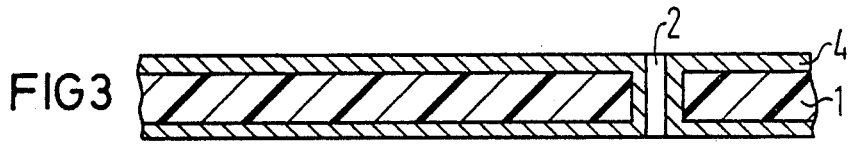

After the staining and cleaning of the substrate 1, it is nucleated to yield a thin layer 3 as in FIG. 2. It is seen that the nucleation 3 was applied onto the surface of the substrate 1 and onto the walls of the through-contact holes 2. The application of the nucleation 3 is accomplished by immersing the substrate 1 into a $PcCl_2$-$SnCl_2$ bath. However, commercially available baths based on palladium-organic compounds have also proven suitable for the application of the nucleation 3.

After the application of the nucleation 3, it is activated to realize a reduced in thickness. Such a step is standard in additive technology. An extremely thin layer was subsequently applied according to FIG. 3 by chemical metal deposition which is free of external current. The base layer that is applied in a commercially available currentless copper bath coats the surfaces of the substrate 1 and the walls of the through-contacting holes 2.

Copper-plating is then performed on the entire surface in currentless fashion and is also voltaically reinforced with copper. As a result, a metal layer 4 is formed with a thickness of, for example, 30 micrometers.

Figure 4:
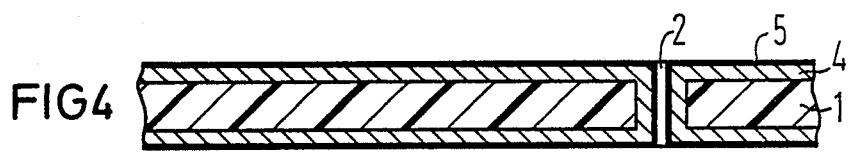

According to FIG. 4, a first etch resist layer 5 is then applied onto metal layer 4 by currentless metal deposition, this etch resist layer 5 may be composed of tin as in the preferred embodiment.

Figure 5:
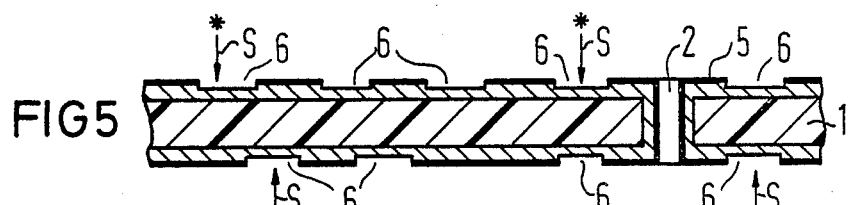

According to FIG. 5, the first etch resist layer 5 is then structured by a scan method with the assistance of a Nd-YAG laser. Radiation from the laser is indicated by arrows S. The selective removal of the etch resist layer 5 is limited to the region 6 that is over the areas of the metal layer that will be etched.

Figure 6:
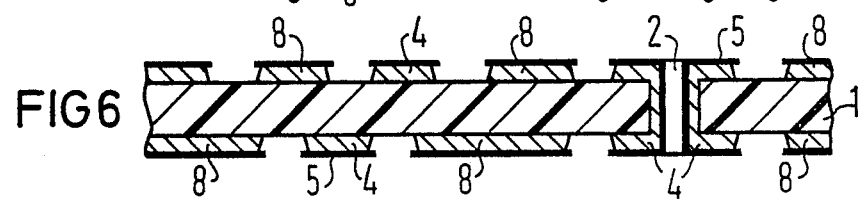

After the selective removal of the first etch resist layer 5, the regions of the metal layer 4 exposed are to be removed by etching, using standard etching techniques. FIG. 6 shows that the interconnect pattern appears after this etching step. The undesired regions 8 of the metal layer 4 still remain between the desired regions 4 or interconnects.

Figure 7:
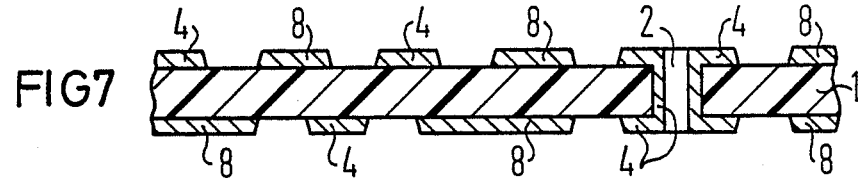
Figure 8:
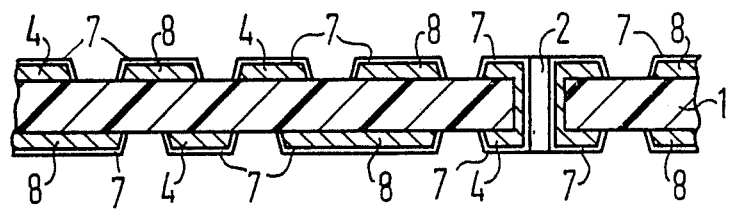
Figure 9:
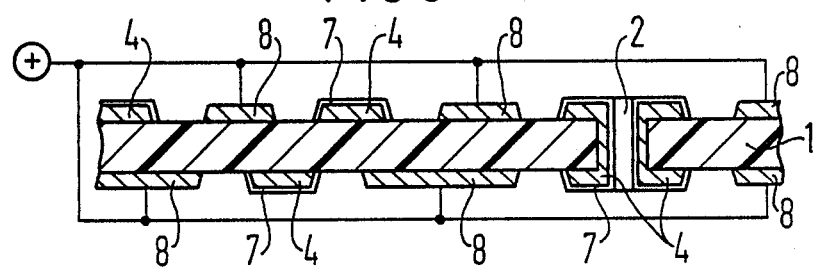
Figure 10:
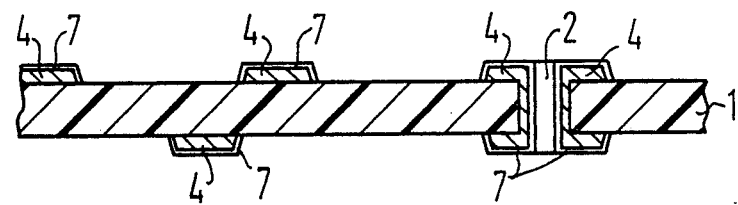

After stripping the first etch resist layer 5 off the metal layer in FIG. 7 by dissolution in an electrolyte solution, a second metallic etch resist layer 7 that is similarly composed of tin, as in the preferred embodiment, is applied onto the regions of the metal layer 4 and metal layer 8, according to FIG. 8. The second etch resist layer also protects the sides of walls of the interconnects. According to FIG. 9, all undesired regions 8 between the interconnects are subsequently anodically contacted. This anodic contact is indicated by a plus sign. As in FIG. 9, the second etch resist layer 7 in the undesired regions 8 is electrolytically dissolved in a suitable anodically contacted. This anodic contact is indicated by a plus sign. As in FIG. 9, the second etch resist layer 7 in the undesired regions 8 is electrolytically dissolved in a suitable electrolyte solution of, for example, boron-hydrogen fluoride.

In the selective removal of the second etch resist layer 7 set forth above, the regions of the etch resist layer 7 on the interconnects are not dissolved. In the next etching step, the exposed, undesired regions 8 of the metal layer 4 can be etched away down to the surface of the substrate 1. According to FIG. 10, only the regions of the metal layer 4 on the substrate surfaces and in the through-contact holes 2 that correspond to the interconnect pattern will remain on the substrate 1 after etching. Since the second etch resist layer 7 remaining on the interconnect pattern is composed of tin, it need not be removed. Component soldering is improved by the tin present in the region of the through-contacts 2. Tempering at a temperature of, for example, 130°, can then be performed. The application of a solder stop lacquer with subsequent hot-tinning of the remaining regions of the metal 4 can also be performed. As required, the remaining second etch resist layer 7 could also be removed by stripping, preferably executed in a chemical way, as in the removal of the first etch resist layer 5.

In another embodiment of the method set forth above, the etch resist layer 5, that is applied onto the metal layer 4, may be organic. An organic etch resist that can be electrophoretically applied is preferred. Such a deposition can be performed by electro immersion backering. A resist material, EAGLE, distributed by the Shiplay Company, is suitable. The pattern of the etch resist layer is again formed by a laser scan method, as indicated by the arrows S in FIG. 5.

Although modifications and changes may be suggested by those skilled in the art, it is the invention of the inventor to embody within the patent warranted hereon, all changes and modifications as reasonably and properly come within his contribution to the art.

I claim as my invention:

1. A method for manufacturing printed circuit boards, comprising the steps of:
   generating a metal layer on an insulating substrate;
   applying a first etch resist layer onto said metal layer;
   selectively removing said etch resist layer so as to expose a first undesired region of said metal layer;
   completely etching said first undesired region away leaving a second undesired region of said metal layer and a desired region of said metal layer;
   applying a second etch resist layer onto said second undesired region and said desired region of said metal layer;
   selectively removing said second etch resist layer from said second undesired region of said metal layer;
   anodically contacting said second undesired region of said metal layer; and
   completely electrolytically etching said second undesired region away so as to leave said desired region of said metal layer remaining.

2. A method for manufacturing printed circuit board as claimed in claim 1, further comprising the steps of:
   staining said insulating substrate so that adhesion of said metal layer to said insulating substrate is improved;
   cleaning said substrate; and
   nucleating said insulating substrate so as to form a thin layer thereon.

3. A method for manufacturing printed circuit boards as claimed in claim 1, further comprising the step of:
   completely removing said first etch resist layer.

4. A method for manufacturing printed circuit boards, as claimed in claim 1, further comprising the step of:
   removing said second etch resist layer from said desired regions of said metal layer.

5. A method for manufacturing printed circuit boards, as claimed in claim 1, further comprising the steps of:
   tempering said insulating substrate and said desired regions of said metal layer; and
   applying a solder stop lacquer onto said insulating substrate and said desired regions of said metal layer.

6. A method for manufacturing printed circuit boards, as claimed in claim 1, wherein the step of generating a metal layer is further defined by: depositing a metal layer of copper.

7. A method for manufacturing printed circuit boards, as claimed in claim 1, wherein the step of generating a metal layer is further defined by:
   generating a metal layer by currentless and voltaic deposition.

8. A method for manufacturing printed circuit boards, as claimed in claim 1, wherein the step of applying a first etch resist layer is further defined by:
   applying a first etch resist layer of tin or a tin-lead alloy.

9. A method for manufacturing printed circuit boards, as claimed in claim 1, wherein the step of applying a second etch resist layer is further defined by:
   applying a second etch resist layer of tin or a tin lead alloy.

10. A method for manufacturing printed circuit boards, as claimed in claim 1, wherein the step of applying a first etch resist layer is further defined by:
    applying a first etch resist layer of an organic compound.

11. A method for manufacturing printed circuit boards, as claimed in claim 1, wherein the step of applying an etch resist layer is further defined by:
    applying a second etch resist layer of an organic compound.

12. A method for manufacturing printed circuit boards, as claimed in claim 1, wherein the step of applying a second etch resist layer is further defined by:
    applying a second etch resist layer onto a top surface and side walls of said second undesired region and said desired region of said metal layer.

13. A method for manufacturing printed circuit boards, as claimed in claim 1, wherein the step of selectively removing said first etch resist layer is further defined by:
    selectively removing said first etch resist layer by electromagnetic radiation generated by a laser whose movement is freely programmable.

14. A method for manufacturing printed circuit boards as claimed in claim 3, wherein the step of completely removing said first etch resist layer is further defined by:
    completely removing said first etch resist layer by dissolution in an electrolyte solution.

15. A method for manufacturing printed circuit boards, as claimed in claim 1, wherein the step of selectively removing said second etch resist layer is further defined by:
    selectively removing said second etch resist layer by dissolution in an electrolyte solution.

16. A method for manufacturing printed circuit boards, as claimed in claim 5, wherein the step of removing said second etch layer is further defined by:
    removing said second etch layer by dissolution in an electrolyte solution.

17. A method for manufacturing printed circuit boards, as claimed in claim 1, wherein the step of generating a metal layer is further defined by:
    generating a metal layer onto an insulating substrate having through-holes with inner walls, said inner walls are processed in the same fashion as said substrate.

* * * * *